US008679357B2

(12) United States Patent
Wakamatsu et al.

(10) Patent No.: US 8,679,357 B2
(45) Date of Patent: Mar. 25, 2014

(54) NANOIMPRINTING METHOD AND METHOD FOR PRODUCING SUBSTRATES UTILIZING THE NANOIMPRINTING METHOD

(71) Applicant: FUJIFILM Corporation, Tokyo (JP)

(72) Inventors: Satoshi Wakamatsu, Shizuoka-ken (JP); Tadashi Omatsu, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 13/848,461

(22) Filed: Mar. 21, 2013

(65) Prior Publication Data

US 2013/0213930 A1 Aug. 22, 2013

Related U.S. Application Data

(63) Continuation of application No. PCT/JP2011/072686, filed on Sep. 22, 2011.

(30) Foreign Application Priority Data

Sep. 24, 2010 (JP) ................................. 2010-213692

(51) Int. Cl.
*C23F 1/02* (2006.01)
*B82Y 40/00* (2011.01)

(52) U.S. Cl.
USPC .................. 216/41; 216/42; 216/44; 216/49; 216/67; 264/320; 977/887; 204/192.34

(58) Field of Classification Search
None
See application file for complete search history.

(56) References Cited

U.S. PATENT DOCUMENTS

| 7,856,288 B2* | 12/2010 | Yoneda et al. ............... 700/206 |
| 2005/0270312 A1* | 12/2005 | Lad et al. ............ 347/1 |
| 2007/0138699 A1* | 6/2007 | Wuister et al. ............... 264/319 |
| 2007/0228593 A1 | 10/2007 | Jones et al. |
| 2007/0237886 A1 | 10/2007 | Dijksman et al. |

(Continued)

FOREIGN PATENT DOCUMENTS

| JP | 2007-273979 | 10/2007 |
| JP | 2007-313439 | 12/2007 |

(Continued)

OTHER PUBLICATIONS

H. Schmitt et al., "UVnanoimprint materials: Surface energies, residual layers, and imprint quality", J. Vac. Sci. Technol. B., vol. 25, issue 3, pp. 785-790, Apr. 27, 2007

*Primary Examiner* — Anita Alanko
(74) *Attorney, Agent, or Firm* — Young & Thompson

(57) ABSTRACT

Droplets of resist material are coated using the ink jet method under conditions that: the viscosity of the resist material is within a range from 8 cP to 20 cP, the surface energy of the resist material is within a range from 25 mN/m to 35 mN/m, the amount of resist material in each of the droplets is within a range from 1 pl to 10 pl, and the placement intervals among the droplets are within a range from 10 μm to 1000 μm. A mold is pressed against the surface of the substrate in a He and/or a depressurized atmosphere such that: an intersection angle formed between a main scanning direction of the ink jet method and the direction of the lines of the linear pattern of protrusions and recesses, which is an intersection angle when pressing the mold against the surface of the substrate, is within a range from 30° to 90°.

4 Claims, 8 Drawing Sheets

(56) References Cited

U.S. PATENT DOCUMENTS

| | | |
|---|---|---|
| 2007/0289530 A1 | 12/2007 | Kataho et al. |
| 2008/0018875 A1 | 1/2008 | Schram et al. |
| 2009/0014917 A1 | 1/2009 | Hodge et al. |
| 2009/0085255 A1* | 4/2009 | Tada et al. ............... 264/401 |
| 2009/0115110 A1 | 5/2009 | Schumaker |
| 2009/0148619 A1 | 6/2009 | La Brake et al. |
| 2009/0267268 A1 | 10/2009 | Yoneda et al. |
| 2010/0092684 A1 | 4/2010 | Kataho et al. |
| 2010/0193994 A1 | 8/2010 | Wuister et al. |
| 2011/0066273 A1 | 3/2011 | Yoneda et al. |
| 2013/0020281 A1* | 1/2013 | Wakamatsu et al. ............ 216/40 |
| 2013/0113863 A1* | 5/2013 | Kodama et al. ................ 347/68 |

FOREIGN PATENT DOCUMENTS

| | | |
|---|---|---|
| JP | 2008-502157 | 1/2008 |
| JP | 2008-042187 | 2/2008 |
| JP | 2009-088376 | 4/2009 |
| JP | 2010-169890 | 8/2010 |
| JP | 2010-183076 | 8/2010 |

* cited by examiner

LINEAR PATTERN OF PROTRUSIONS AND RECESSES P1

STRAIGHT LINEAR PATTERN OF PROTRUSIONS AND RECESSES P2

LINE TRANSFER REGION R1

STRAIGHT LINE TRANSFER REGION R2

LINEAR (STRAIGHT) PATTERN OF PROTRUSIONS AND RECESSES P1 (P2)

LINE (STRAIGHT LINE) TRANSFER REGION R1 (R2)

RESIDUAL FILM PROFILE IN THE VERTICAL DIRECTION
WITH RESPECT TO INK JET MAIN SCANNING DIRECTION
(a: DROPLET UNIT LATTICE INTERVAL)

NANOIMPRINTING METHOD AND METHOD FOR PRODUCING SUBSTRATES UTILIZING THE NANOIMPRINTING METHOD

TECHNICAL FIELD

The present invention is related to a nanoimprinting method that employs a mold having a fine pattern of protrusions and recesses, and particularly to a method that performs nanoimprinting after coating a substrate with resist using the ink jet method. The present invention is also related to a method for producing substrates employing the nanoimprinting method.

BACKGROUND ART

There are high expectations regarding utilization of pattern transfer techniques that employ a nanoimprinting method to transfer patterns onto resist coated on objects to be processed, in applications to produce magnetic recording media such as DTM (Discrete Track Media) and BPM (Bit Patterned Media) and semiconductor devices.

The nanoimprinting method is a development of the well known embossing technique employed to produce optical discs. In the nanoimprinting method, a metal original (commonly referred to as a mold, a stamper, or a template), on which a pattern of protrusions and recesses is formed, is pressed against resist coated on an object to be processed. Pressing of the original onto the resist causes the resist to mechanically deform or to flow, to precisely transfer the fine pattern. If a mold is produced once, nano level fine structures can be repeatedly molded in a simple manner. Therefore, the nanoimprinting method is an economical transfer technique that produces very little harmful waste and discharge. Therefore, there are high expectations with regard to application of the nanoimprinting method in various fields.

In the conventional nanoimprinting method, an object to be processed was uniformly coated with resist by the spin coat method or the like, to form a resist film thereon. Thereafter, the surface of the mold having the pattern of protrusions and recesses thereon is pressed against the resist film, to perform pattern transfer. However, when pattern transfer is performed in this manner, there are cases in which fluctuations occur in the thickness of residual film (residual resist film which is not pressed during imprint molding, and remains at positions corresponding to the protrusions of the pattern of protrusions and recesses of the mold; also referred to as "residue") of the resist film on which the pattern has been transferred. There are cases in which such fluctuations in the thickness of the resist film and residual gas cause imprinting defects (missing portions of the resist film which are caused by resist material not being supplied when the mold is pressed against the resist film).

In view of the above, PCT Japanese Publication No. 2008-502157, U.S. Patent Application Publication Nos. 20090014917, 20090115110, 20070228593, and 20090148619, and Japanese Unexamined Patent Publication No. 2007-313439 disclose methods that employ the ink jet method to control the amount of resist to be coated at each region of objects to be processed, according to the pattern density (the percentage of protrusions or recesses per unit area when a pattern of protrusions and recesses is viewed from above) of patterns of protrusions and recesses when molds are pressed against the objects to be processed.

Specifically, PCT Japanese Publication No. 2008-502157 and US Patent Application Publication Nos. 20090014917 and 20090115110 disclose methods for determining intervals among a plurality of droplets when producing droplet arrangement patterns (positional distributions on objects to be processed when arranging droplets of resist material using the ink jet method) using the vertical and horizontal lengths of regions on which the resist material is coated. U.S. Patent Application Publication Nos. 20070228593 and 20090148619 disclose methods for uniformizing residual films, by designing sizes per each droplet, designing droplet arrangement patterns, designing the states of interfaces between the surfaces of the droplets and the surfaces of substrates onto which the droplets are coated, etc. Japanese Unexamined Patent Publication No. 2007-313439 discloses a method for uniformizing the intervals among a plurality of droplets on a substrate, by varying jetting intervals at the inner peripheral side and the outer peripheral side of the substrate when coating the substrate with droplets by the ink jet while rotating the substrate.

That is, the publications listed above employ the ink jet method to reduce fluctuations in the thickness of residual films and imprinting defects, by optimizing the positional distribution (droplet arrangement pattern) at which droplets of resist material are arranged on objects to be processed according to pattern densities.

However, if a droplet arrangement pattern is simply optimized according to the pattern density of a pattern of protrusions and recesses of a mold as disclosed in the publications listed above, there is a problem that imprinting defects due to fluctuations in the thickness of a residual film and residual gas cannot be suppressed in the case that droplet arrangement defects, in which droplets are not arranged according to the droplet arrangement pattern, occur. Droplet arrangement defects are likely to occur due to factors such as variations in the arrangement intervals among a plurality of droplets caused by scanning of an ink jet head in a sub scanning direction, and the droplets not being jetted caused by clogs in ink jet nozzles.

FIGS. 8A through 8C are diagrams that illustrate how droplet arrangement defects occurs due to droplets not being jetted caused by clogs in ink jet nozzles. For example, if a clogged portion 20 is present in the nozzles of an ink jet head 10 (FIG. 8A), droplet arrangement defects 21, at which droplets D are not coated on a substrate 3 according to a droplet arrangement pattern P5, occur (FIG. 8B). If a mold having a straight linear pattern of protrusions and recesses P2 is pressed against the coated droplets D in a state that the droplet arrangement defects 21 are present, sufficient resist material is not supplied at the region of the substrate 3 where the droplet arrangement defects 21 are present. Accordingly, imprinting defects 22 occur in the resist film, on to which the pattern is transferred (FIG. 8C).

The present invention has been developed in view of the foregoing circumstances. It is an object of the present invention to provide a nanoimprinting method that employs the ink jet method to coat a substrate with droplets of resist material, in which imprinting defects due to fluctuations in the thickness of residual film and residual gas are suppressed even in cases that droplet arrangement defects occur.

Further, it is another object of the present invention to provide a method for producing substrates that enables highly accurate and high yield production of substrates, in which imprinting defects due to fluctuations in the thickness of a residual film and residual gas are suppressed.

DISCLOSURE OF THE INVENTION

A nanoimprinting method of the present invention that achieves the above object comprises:

coating a substrate with a plurality of droplets of resist material by the ink jet method; and pressing a linear pattern of protrusions and recesses of a mold onto the surface of the substrate which is coated with the droplets, to spread the droplets on the substrate, to form a resist film constituted by bonds among the spread plurality of droplets and to transfer the linear pattern of protrusions and recesses onto the resist film; characterized by:

the droplets being coated under the conditions of: the viscosity of the resist material being within a range from 8 cP to 20 cP, the surface energy of the resist material being within a range from 25 mN/m to 35 mN/m, the amount of resist material in each of the plurality of droplets being within a range from 1 pl to 10 pl, and the placement intervals among the droplets being within a range from 10 μm to 1000 μm; and the mold being pressed against the surface of the substrate in a He and/or a depressurized atmosphere; such that:

an intersection angle formed between a main scanning direction of the ink jet method when coating the substrate with the droplets and the direction of the lines of the linear pattern of protrusions and recesses, which is an intersection angle when pressing the mold against the surface of the substrate, is within a range from 30° to 90°.

In the present specification, the expression "linear pattern of protrusions and recesses" refers to a pattern of protrusions and recesses that causes anisotropy to occur in the spreading directions of droplets such that the shapes of the droplets approximate ellipses when the pattern is pressed against the droplets, due to the shape of the pattern. The most typical linear pattern of protrusions and recesses is a pattern of protrusions and recesses of the line and space type. The linear pattern of protrusions and recesses may be included at least at a portion of the pattern of protrusions and recesses on the surface of the mold.

The expression "resist film constituted by bonds among the spread plurality of droplets" refers to a film of resist material formed by droplets having overlapping spaces in which they spread bonding to each other when the droplets of resist materials are spread by being pressed.

The expression "a main scanning chi reaction of the ink jet method when coating the substrate with the droplets" refers to a main scanning direction of the ink jet method, using the substrate on which the droplets are coated on as a reference.

The expression "direction of the lines of the linear pattern of protrusions and recesses" refers to a direction in which spreading of the droplets is facilitated, from among the directions along the surface of the mold on which the pattern is formed.

The expression "intersection angle" formed between the main scanning direction and the direction of the lines refers to the acute angle, from between the angles formed by the main scanning direction and the direction of the lines.

The expression "intersection angle when pressing the mold against the surface of the substrate" refers to the intersection angle when the substrate and the mold are in a positional relationship in which the mold and the substrate face each other with the surface of the mold having the linear pattern of protrusions and recesses thereon facing the substrate.

In the nanoimprinting method of the present invention, it is preferable for the resist material to be a photocuring resin.

A method for producing substrates of the present invention comprises:

forming a resist film, on which a pattern of protrusions and recesses is formed, on a substrate by the nanoimprinting method of the present invention; and performing dry etching using the resist film as a mask, to form a pattern of protrusions and recesses corresponding to the pattern of protrusions and recesses transferred on the resist film, to obtain a substrate having a predetermined pattern thereon.

In the nanoimprinting method of the present invention, the droplets are coated under the conditions of: the viscosity of the resist material being within a range from 8 cP to 20 cP, the surface energy of the resist material being within a range from 25 mN/m to 35 mN/m, the amount of resist material in each of the plurality of droplets being within a range from 1 pl to 10 pl, and the placement intervals among the droplets being within a range from 10 μm to 1000 μm; and the mold is pressed against the surface of the substrate in a He and/or a depressurized atmosphere; such that: the intersection angle formed between a main scanning direction of the ink jet method when coating the substrate with the droplets and the direction of the lines of the linear pattern of protrusions and recesses, which is an intersection angle when pressing the mold against the surface of the substrate, is within a range from 30° to 90°. Therefore, the droplets can be caused to spread so as to compensate for droplet arrangement defects. This is because anisotropy occurs in the spreading direction of the droplets due to the shape of the linear pattern of protrusions and recesses. Thereby, imprinting defects due to fluctuations in the thickness of residual film and residual gas are suppressed even in cases that droplet arrangement defects occur.

In the method for producing substrates of the present invention: a resist film, on which a pattern of protrusions and, recesses is formed, is provided on a substrate by the nanoimprinting method of the present invention; and dry etching is performed using the resist film as a mask. Therefore, highly accurate and high yield production of substrates becomes possible.

BEST MODE FOR CARRYING OUT THE INVENTION

Figure 1A:
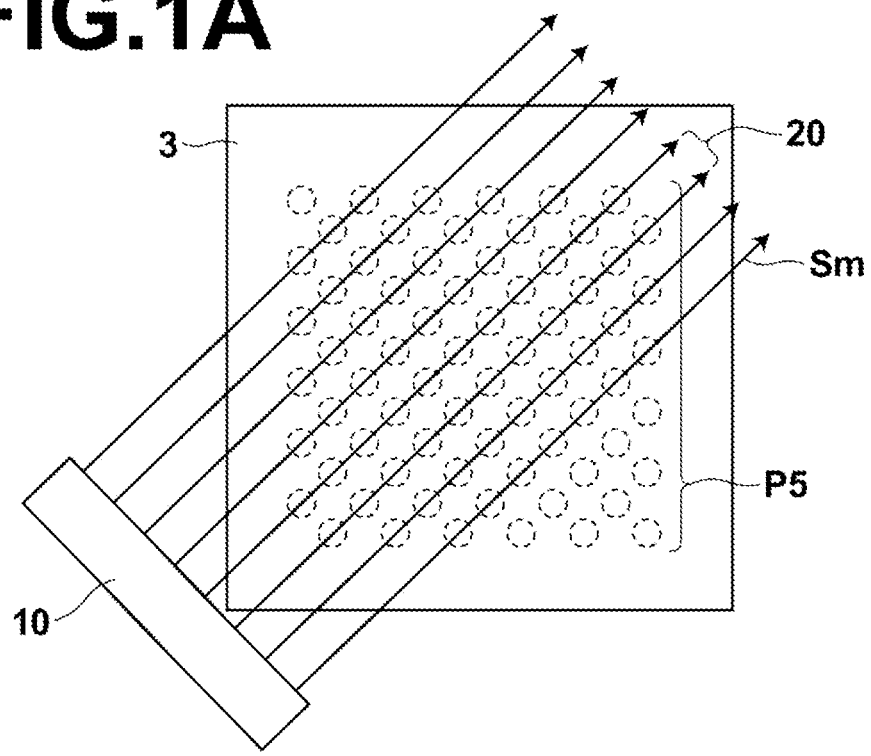
FIG. 1A is a diagram that schematically illustrates the manner in which an ink jet printer is employed to arrange droplets on a quartz substrate according to a droplet arrangement pattern.

Hereinafter, embodiments of the present invention will be described with reference to the attached drawings. However, the present invention is not limited to the embodiments to be described below. Note that in the drawings, the dimensions of the constitutive elements are drawn differently from the actual dimensions thereof, in order to facilitate visual understanding thereof.

[Nanoimprinting Method]

First, an embodiment of a nanoimprinting method of the present invention will be described. Note that in this embodiment, photocuring nanoimprinting that employs a photocuring resin as resist material and cures a resist film with light will be described as an example of the nanoimprinting method.

Figure 1B:
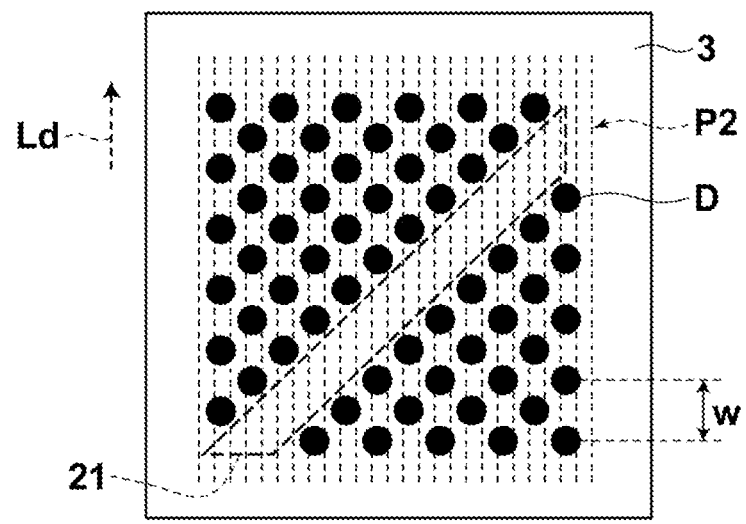
FIG. 1B is a diagram that schematically illustrates the manner in which a mold having a straight linear pattern of protrusions and recesses is pressed against droplets which are arranged on a quartz substrate.
Figure 1C:
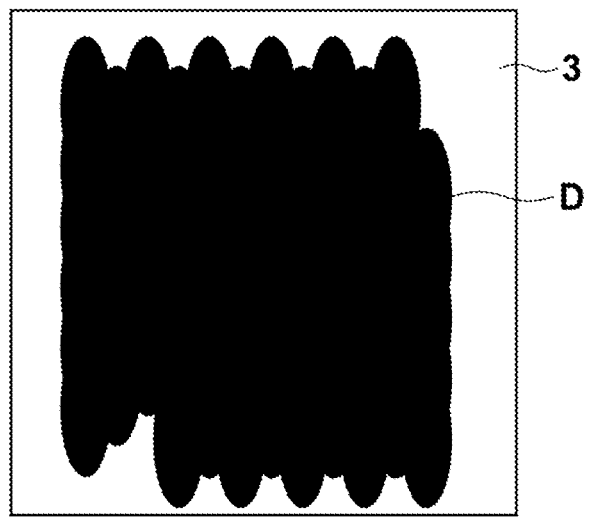
FIG. 1C is a diagram that schematically illustrates the manner in which droplets spread as observed from the underside of a quartz substrate, in the case that a mold having a straight linear pattern of protrusions and recesses is pressed against the droplets which are arranged on the quartz substrate.

FIG. 1A is a conceptual diagram that schematically illustrates the manner in which an ink jet printer is employed to arrange droplets D on a quartz substrate 3 according to a droplet arrangement pattern P5. FIG. 1B and FIG. 1C are diagrams that schematically illustrate the manner in which droplets D spread as observed from the underside of a quartz substrate 3, in the case that a mold having a straight linear pattern of protrusions and recesses is pressed against the droplets D which are arranged on the quartz substrate 3. The nanoimprinting method of the present embodiment coats a straight line transfer region of the quartz substrate 3 that faces a straight linear pattern of protrusions and recesses P2 of a Si mold with the droplets D using the ink jet method. The droplets D, which are droplets of photocuring resin, are coated under the conditions of: the viscosity of the resist material being within a range from 8 cP to 20 cP, the surface energy of the resist material being within a range from 25 mN/m to 35 mN/m, the amount of resist material in each of the plurality of droplets being within a range from 1 pl to 10 pl, and the placement intervals among the droplets being within a range from 10 μm to 1000 μm. The straight linear pattern of protrusions and recesses of the Si mold is pressed against the surface of the quartz substrate 3 having the droplets D coated thereon in a He and/or a depressurized atmosphere, to cause the droplets D to spread on the quartz substrate 3. The spread droplets D bond with each other to form a photocuring resin film. At this time, an intersection angle formed between a main scanning direction Sm of the ink jet method when coating the quartz substrate 3 with the droplets D and the direction Ld of the lines of the straight linear pattern of protrusions and recesses P2, which is an intersection angle when pressing the Si mold against the surface of the quartz substrate 3, is within a range from 30° to 90° (FIG. 1A and FIG. 1B). Thereafter, the photocuring resin film is exposed to ultraviolet rays from the side of the quartz substrate 3 to cure the photocuring resin film. Finally, the Si mold is separated from the photocuring resin film after it cures, to transfer the straight linear pattern of protrusions and recesses P2 onto the photocuring resin film. The photocuring resin film functions as a resist film during an etching step to be performed later.

Particularly, the intersection angle formed between a main scanning direction Sm of the ink jet method when coating the quartz substrate 3 with the droplets D and the direction Ld of the lines of the straight linear pattern of protrusions and recesses P2, which is the intersection angle when pressing the Si mold against the surface of the quartz substrate 3, is set to be within a range from 30° to 90° (FIG. 1A and FIG. 1B) in the nanoimprinting method of the present invention. Here, setting the intersection angle to be within a range from 30° to 90° refers to a case in which the step of coating the quartz substrate 3 with the droplets D is directly controlled to satisfy this condition, and a case in which the step of pressing the Si mold against the photocuring resin film on the surface of the quartz substrate 3 is directly controlled to satisfy this condition. That is, in the case that the positional relationship between the Si mold and the substrate when pressing the Si mold against the photocuring resin film is determined in advance, the direction Ld of the lines of the linear pattern of protrusions and recesses of the Si mold is necessarily determined with respect to the substrate. Accordingly, in this case, the main scanning direction Sm of the ink jet method is controlled as appropriate, taking the direction Ld of the lines, which is determined with respect to the substrate, into consideration. On the other hand, in the case that the positional relationship between the Si mold and the substrate when pressing the Si mold against the photocuring resin film is not determined in advance, the direction Ld of the lines of the linear pattern of protrusions and recesses of the Si mold is not determined with respect to the substrate. Accordingly, in this case, the positional relationship between the Si mold and the substrate when pressing the Si mold against the substrate is controlled as appropriate after the droplets are coated arbitrarily by the ink jet method, taking the main scanning direction Sm of the ink jet method into consideration.

(Si Mold)

The Si mold to be utilized in the present embodiment may be produced by the following procedures, for example. First, a Si substrate is coated by a photoresist liquid such as a novolac resin or an acrylic resin, e.g. PMMA (Polymethyl Methacrylate), by the spin coat method or the like, to form a photoresist layer. Next, a laser beam (or an electron beam) is irradiated onto the Si substrate, to expose a predetermined pattern on the surface of the photoresist layer. Then, the photoresist layer is developed to remove the exposed portions. Finally, selective etching is performed by RIE or the like, using the photoresist layer after the exposed portions are removed, to obtain the Si mold having the predetermined pattern.

The mold to be employed in the imprinting method of the present invention may be that which has undergone a mold release process to improve separation properties between the photocuring resin and the mold. Examples of such a mold include: those which have been processed by silicone or fluorine silane coupling agents. Commercially available mold release agents such as Optool DSX by Daikin Industries K.K. and Novec EGC-1720 by Sumitomo 3M K.K. may be favorably employed. Meanwhile, although the present embodiment is described as a case in which the Si mold is employed, the mold is not limited to an Si mold, and a quartz mold may be employed. In this case, the quartz mold may be produced by the method for producing a mold to be described later.

(Photocuring Resin)

The material of the photocuring resin is not particularly limited. In the present embodiment, a photocuring resin prepared by adding a photopolymerization initiator (approximately 2% by mass) and a fluorine monomer (0.1% to 1% by mass) to a polymerizable compound may be employed. An antioxidant (approximately 1% by mass) may also be added as necessary. The photocuring resin produced by the above procedures can be cured by ultraviolet light having a wavelength of 360 nm. With respect to resins having poor solubility, it is preferable to add a small amount of acetone or acetic ether to dissolve the resin, and then to remove the solvent.

Examples of the polymerizable compound include: benzyl acrylate (Viscoat #160 by Osaka Organic Chemical Industries, K.K.) ethyl carbitol acrylate (Viscoat #190 by Osaka Organic Chemical Industries, K.K.), polypropylene glycol diacrylate (Aronix M-220 by TOAGOSEI K.K.), and trimethylol propane PO denatured triacrylate (Aronix M-310 by TOAGOSEI K.K.). In addition, a compound A represented by the following chemical formula (1) may also be employed as the polymerizable compound.

[Chemical Formula (1)]

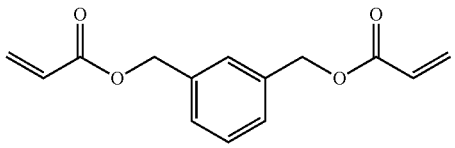

Examples of the photopolymerization initiating agent include alkyl phenone type photopolymerization initiating agents, such as 2-(dimethyl amino)-2-[(4-methylphenyl) methyl]-1-[4-(4-morpholinyl)phenyl]-1-butanone (IRGACURE 379 by Toyotsu Chemiplas K.K.).

In addition, a compound B represented by the following chemical formula (2) may be employed as the fluorine monomer.

[Chemical Formula (2)]

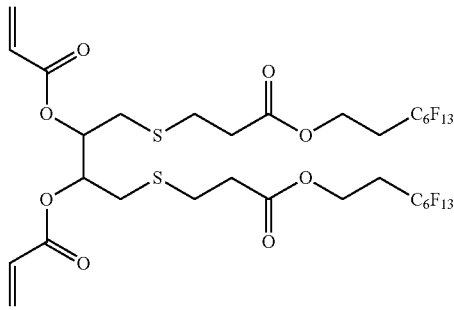

In the present invention, the viscosity of the resist material is within a range from 8 cP to 20 cP, and the surface energy of the resist material is within a range from 25 mN/m to 35 mN/m. Here, the viscosity of the resist material was measured by a RE-80L rotating viscosity meter (by Touki Industries K.K.) at 25±0.2 C°. The rotating speeds during measurements were: 100 rpm at viscosities greater than or equal to 0.5 cP and less than 5 cP; 50 rpm at viscosities greater than or equal to 5 cP and less than 10 cP; 20 rpm at viscosities greater than or equal to 10 cP and less than 30 cP; and 10 rpm at viscosities greater than or equal to 30 cP and less than 60 cP. The surface energy of the resist material was measured using the technique disclosed in H. Schmitt et al., "UV nanoimprint materials: Surface energies, residual layers, and imprint quality", J. Vac. Sci. Technol., B., Vol. 25, Issue 3, pp. 785-790, 2007. Specifically, the surface energies of Si substrates that underwent UV ozone processes and the surface of which were treated with Optool DSX (by Daikin K.K.) were measured, then the surface energy of the resist material was calculated from the contact angles thereof with respect to the substrates.

(Substrate)

The quartz substrate is preferred, as it enables the photocuring resin to be exposed to light. The quartz substrate to be employed is not particularly limited as long as it has light transmissive properties and has a thickness of 0.3 mm or greater, and may be selected as appropriate according to intended use. Examples of the quartz substrate include: those in which the surface of a quartz substrate is coated with a silane coupling agent; those in which a metal layer of Cr, W, Ti, Ni, Ag, Pt, or Au is provided on the surface of a quartz substrate; those in which a metal oxide layer of $CrO_2$, $WO_2$, or $TiO_2$ is provided on the surface of a quartz substrate; and those in which a metal layer of Cr, W, Ti, Ni, Ag, Pt, or Au or a metal oxide layer of $CrO_2$, $WO_2$, or $TiO_2$ is provided on the surface of a quartz substrate, which is then coated with a silane coupling agent. The thickness of the metal layer or the metal oxide layer is generally 30 nm or less, and preferably 20 nm or less. If the thickness of the metal layer or the metal oxide layer exceeds 30 nm, the UV transmissive properties deteriorate, and curing failure of the photocuring resin becomes likely to occur.

In addition, the expression "light transmissive properties" refers to a degree of light transmissivity that enables sufficient curing of the photocuring resin film when light enters the side of the substrate opposite that on which the photocuring resin film is formed. Specifically, the "light transmissive properties" refers to light transmissivity of 5% or greater with respect to light having wavelengths of 200 nm or greater from the side of the substrate opposite that on which the photocuring resin film is formed to the side of the substrate on which the photocuring resin film is formed.

It is preferable for the thickness of the quartz substrate to be 0.3 mm or greater. If the thickness of the quartz substrate is less than 0.3 mm, it is likely to become damaged during handling or due to pressure during imprinting.

Meanwhile, substrates to be employed with the quartz mold are not limited with regard to the shape, the structure, the size or the material thereof, and may be selected according to intended use. With respect to the shape of the substrate, a substrate having a discoid shape may be utilized in the case that nanoimprinting is performed to produce a data recording medium. With respect to the structure of the substrate, a single layer substrate may be employed, or a laminated substrate may be employed. With respect to the material of the substrate, the material may be selected from among known materials for substrates, such as silicon, nickel, aluminum, glass, and resin. These materials may be utilized singly or in combination. The substrate may be produced, or may be those which are commercially available. The thickness of the substrate is not particularly limited, and may be selected according to intended use. However, it is preferable for the thickness of the substrate to be 0.05 mm or greater, and more preferably 0.1 mm or greater. If the thickness of the substrate is less than 0.05 mm, there is a possibility that the substrate will flex during close contact with the mold, resulting in a uniform close contact state not being secured.

(Linear Pattern of Protrusions and Recesses)

Straight linear patterns of protrusions and recesses are formed on the Si mold as patterns to be transferred. The expression "straight linear pattern of protrusions and recesses" refers to the aforementioned linear pattern of protrusions and recesses, which is a pattern of protrusions and recesses that causes the long axes of elliptical shapes that the droplets approximate when the pattern is pressed against the droplets to be oriented in the same direction.

The straight linear direction of the straight linear pattern of protrusions and recesses P2 is the aforementioned direction of the lines, and refers particularly to the direction along the long axes of the plurality of ellipses. As described previously, the expression "direction of the lines of the linear pattern of protrusions and recesses" refers to a direction in which spreading of the droplets is facilitated, from along the directions along the pattern formation surface of the mold. In other words, the expression "direction of the lines of the linear pattern of protrusions and recesses" refers to a direction along the long axes of the plurality of ellipses that the droplets approximate when the linear pattern of protrusions and recesses is pressed against the droplets. In the case that the linear pattern of protrusions and recesses includes curved lines and/or zigzag shaped patterns of protrusions and recesses, the directions of the lines thereof reflect such shapes, and are curved lines or zigzags.

Figure 2A:
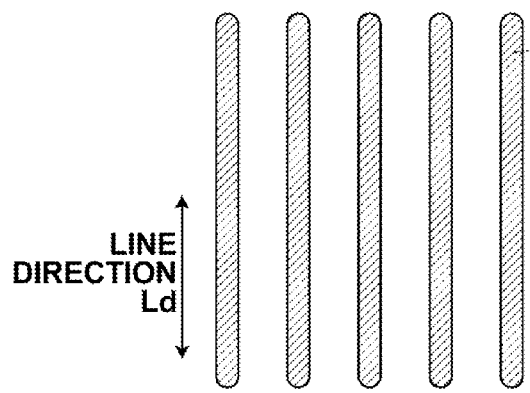
FIG. 2A is a diagram that illustrates examples of linear patterns of protrusions and recesses and non linear patterns of protrusions and recesses.
Figure 2B:
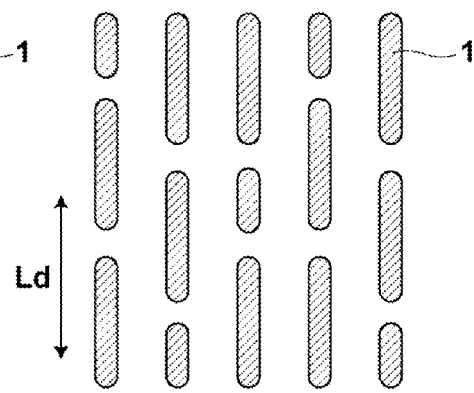
FIG. 2B is a diagram that illustrates examples of linear patterns of protrusions and recesses and non linear patterns of protrusions and recesses.
Figure 2C:
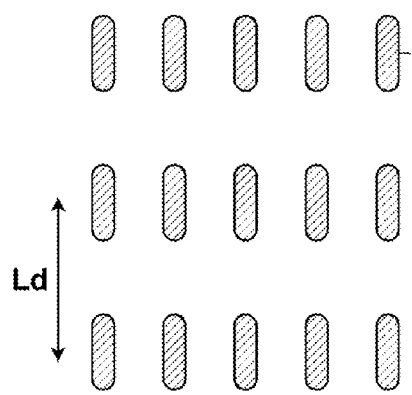
FIG. 2C is a diagram that illustrates examples of linear patterns of protrusions and recesses and non linear patterns of protrusions and recesses.
Figure 2D:
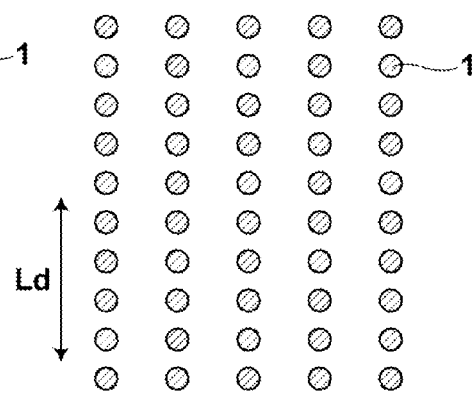
FIG. 2D is a diagram that illustrates examples of linear patterns of protrusions and recesses and non linear patterns of protrusions and recesses.
Figure 2E:
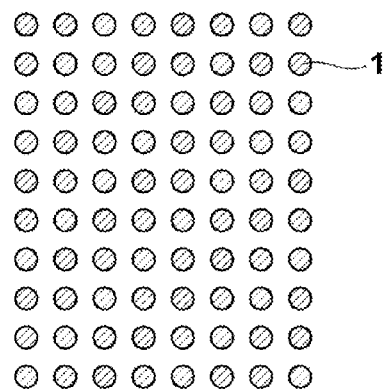
FIG. 2E is a diagram that illustrates examples of linear patterns of protrusions and recesses and non linear patterns of protrusions and recesses.

For example, FIGS. 2A through 2D are diagrams that schematically illustrate examples of linear patterns of protrusions and recesses. FIG. 2A, FIG. 2B, and FIG. 2C are schematic diagrams that illustrate patterns of protrusions and recesses of the line and space type, in which elongated protrusions 1 are arranged parallel to each other. FIG. 2D is a schematic diagram that illustrates a pattern, in which rows of dot shaped protrusions 1, which are densely arranged in a single direction, are arranged parallel to each other. In these patterns, it is easier for the coated droplets to spread within spaces between the protrusions 1. Therefore, anisotropy occurs in the spreading of the droplets, and the shapes of the spread droplets approximate ellipses. Accordingly, the direction of the lines is a direction along the length direction of the elongate protrusions, or a direction along the length direction of the rows of densely arranged dot shaped protrusions. FIG. 2A through FIG. 2D illustrate cases in which the protrusions 1 are formed and/or arranged as straight lines. However, the linear patterns are not limited to straight linear patterns, and the linear patterns may be formed or arranged such that they curve and/or zigzag. Note that FIG. 2E is a diagram that schematically illustrates a pattern in which dot shaped protrusions 1 are uniformly arranged in both the vertical and horizontal directions. Because anisotropy does not clearly occur in the spreading direction of droplets, such a pattern is not a linear pattern of protrusions and recesses as defined in the present specification.

There are cases that a curved direction of lines or a plurality of straight linear directions are recognized, if the linear pattern of protrusions and recesses includes curved lines and/or zigzag shaped patterns of protrusions and recesses. In such cases, it is not easy for the directions of the lines of such linear patterns of protrusions and recesses to be defined as a single straight linear direction. Therefore, the shapes of the linear patterns of protrusions and recesses are considered individually, and straight linear directions are selected as a direction of lines that reflects the linear patterns of protrusions and recesses. The selection of the direction is performed taking the direction in which spreading of droplets is facilitated as a whole in to consideration. More specifically, it is preferable for the process of pressing the linear patterns of protrusions and recesses against a plurality of droplets which are coated on a substrate to be performed experimentally in advance. Then, the shapes of each of the spread plurality of droplets are observed, and the direction that the greatest number of droplets spread in is selected as the "straight linear direction that reflects the direction of lines of the linear pattern of protrusions and recesses". Note that the selection of the direction described above is not always necessary. For example, in the case that droplets are coated while rotating a discoid substrate, it is possible to match the main scanning direction of the ink jet method and a direction of lines along the circumferential direction, even if an ink jet head is fixed.

Figure 3A:
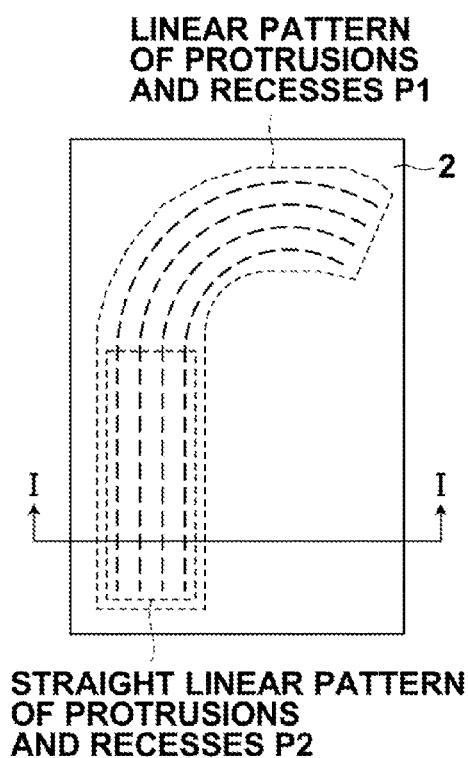
FIG. 3A is a diagram that schematically illustrates a mold having linear patterns of protrusions and recesses formed thereon.
Figure 3B:
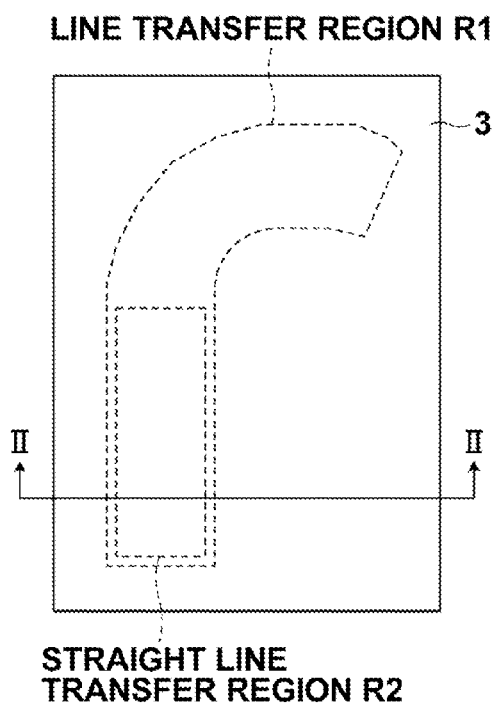
FIG. 3B is a diagram that schematically illustrates a substrate onto which the mold of FIG. 3A is pressed as a target of processing.
Figure 4A:
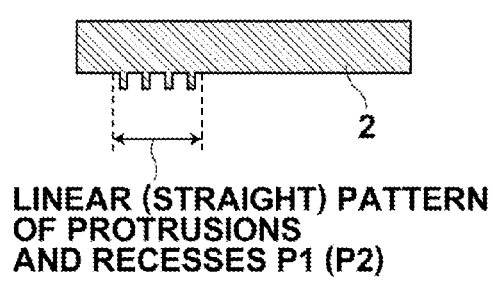
FIG. 4A is a schematic sectional diagram taken along line I-I of FIG. 3A.
Figure 4B:
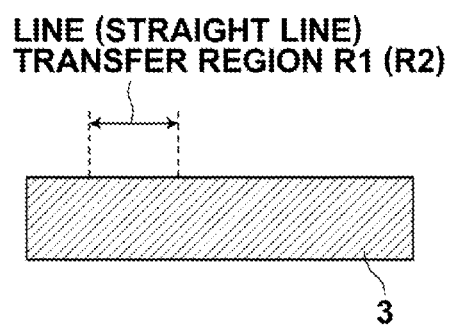
FIG. 4B is a schematic sectional diagram taken along line II-II of FIG. 3B.

A straight line transfer region is a line transfer region. Particularly, the straight line transfer region is a region of the substrate that faces a straight linear pattern of protrusions and recesses. Here, the "line transfer region" refers to the region of the substrate that faces the linear pattern of protrusions and recesses when the linear pattern of protrusions and recesses is pressed against the substrate. That is, as illustrated in FIG. 3B and FIG. 4B, the "line transfer region" and the "straight line transfer region" refer to a region of the substrate (R1 or R2) that faces a linear pattern of protrusions and recesses P1 or a straight linear pattern of protrusions and recesses P2 when the linear pattern of protrusions and recesses P1 or the straight linear pattern of protrusions and recesses P2 is pressed against the substrate 3. FIG. 3A is a diagram that schematically illustrates a mold having linear patterns of protrusions and recesses formed thereon. FIG. 3B is a diagram that schematically illustrates a substrate onto which the mold of FIG. 3A is pressed as a target of processing. FIG. 4A is a schematic sectional diagram taken along line I-I of FIG. 3A, and FIG. 4B is a schematic sectional diagram taken along line II-II of FIG. 3B. Region R1 of the substrate 3 illustrated in FIG. 4B that faces the pattern of protrusions and recesses is a line transfer region, and particularly a straight line transfer region R2 in this case.

(Method for Coating the Photocuring Resin)

An ink jet printer is employed to arrange the droplets of photocuring resin onto the substrate. Examples of ink jet heads that expel photocuring resin from nozzles include the piezoelectric type, the thermal type, and the electrostatic type. From among these, the piezoelectric type of ink jet head, in which the amount of photocuring resin in each coated droplet and the expulsion speed are adjustable, is preferable. The amount of photocuring resin in each coated droplet and the expulsion speed are set and adjusted prior to arranging the droplets of photocuring resin onto the substrate. For example, it is preferable for the amount of photocuring resin in each coated droplet to be adjusted to be greater at regions at which the spatial volume of the recesses of the pattern of protrusions and recesses is large, and to be smaller at regions at which the spatial volume of the recesses of the pattern of protrusions and recesses is small. Such adjustments are controlled as appropriate according to the amount of photocuring resin expelled in each droplet. Specifically, the amount of photocuring resin in each coated droplet may be controlled by expelling five droplets in the case that the amount of photocuring resin in each coated droplet is set to 5 pl and an ink jet head that expels 1 pl of photocuring resin in each droplet is employed, for example. In the present invention, the amount of photocuring resin in each coated droplet is within a range from 1 pl to 10 pl. The amount of photocuring resin in each coated droplet may be obtained by measuring the three dimensional shapes of droplets, which are expelled onto a substrate under the same conditions in advance, with a confocal microscope or the like, and by calculating the volumes thereof from the shapes.

The droplets are arranged on the substrate according to a predetermined droplet arrangement pattern after the adjustments are performed. The droplet arrangement pattern is a two dimensional coordinate system constituted by a group of lattice points that correspond to the arrangement locations of the droplets, and include information regarding which regions of the substrate become line transfer regions or straight line transfer regions.

In the present invention, the arrangement intervals among the plurality of droplets are set to be within a range from 10 μm to 1000 μm. The arrangement intervals among the droplets are obtained by measuring the distances among the centers of droplets arranged on the substrate by an ink jet apparatus with an optical microscope or the like capable of performing the measurements. Repeating such measurements a plurality of times while changing the ink jet conditions, for example, will enable understanding of the relationship between the droplet intervals and the ink jet conditions.

Figure 5:
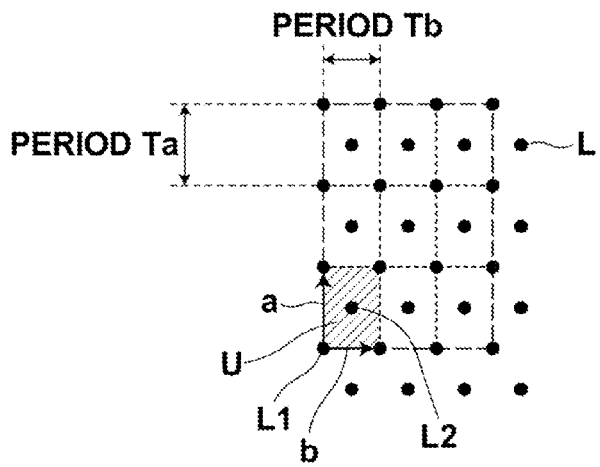
FIG. 5 is a diagram that illustrates an example of a droplet arrangement pattern having periodicity.

In the case that the droplet arrangement pattern has a basic unit lattice that exhibits periodicity as illustrated in FIG. 5, the amount of photocuring resin in each arranged droplet and the arrangement intervals among the plurality of droplets may be treated in the following manner. Here, the "basic unit lattice" refers to the smallest repeating unit of the droplet arrangement pattern that exhibits periodicity. Specifically, in the case described above, the amount of photocuring resin in each of the plurality of arranged droplets is the amount of photocuring resin in each droplet corresponding to lattice points that represent the basic unit lattice U, and may be treated as an average amount of photocuring resin in arranged droplets among basic unit lattices. Here, the lattice point that represents the basic unit lattice U refers to lattice points of which the total volume of the droplets corresponding thereto constitute a predetermined value (90% or greater, for example) of the total volume of the droplets corresponding to all lattice points within the unit basic lattice U. It is not necessary for the representative lattice point to be a single point. Meanwhile, in the case described above, the arrangement intervals among the plurality of droplets may be treated as the period of the basic unit lattice. Here, in the case that the periods along the two axes within a two dimensional plane of the droplet pattern are different, the average of the two periods may be treated as the period of the basic unit lattice.

The manner in which the basic unit lattice U is designated is not particularly limited. For example, in FIG. 5, a parallelogram formed by a vector a and a vector b of lengths corresponding to a single period of the periodicities Ta and Tb in the A direction and the B direction, respectively, is designated as the basic unit lattice U. Considering the objective of suppressing fluctuations in thickness and defects due to residual gas, as well as filling rates, it is preferable for unit structures that constitute the basic unit lattice to include a single lattice point $L1=0·a+0·b$, or the lattice point L1 and another lattice point $L2=1/2·a+1/2·b$. Here, a and b represent the vectors a and b. Here, the "unit structure" refers to the specific arrangement of lattice points that constitute the basic unit lattice. That is, a group of lattice points that constitute the droplet arrangement pattern is expressed by the basic unit lattices having the unit structure being repeated according to the periodicity thereof.

(Mold Pressing Step)

The amount of residual gas is reduced by pressing the mold against the substrate after depressurizing the atmosphere between the mold and the substrate, or by causing the atmosphere between the mold and the substrate to be a vacuum. However, there is a possibility that the photocuring resin will volatilize before curing in a vacuum environment, causing difficulties in maintaining a uniform film thickness. Therefore, it is preferable to reduce the amount of residual gas by causing the atmosphere between the substrate and the mold to be a He atmosphere or a depressurized He atmosphere. He passes through the quartz substrate, and therefore the amount of residual gas (He) will gradually decrease. As the passage of He through the quartz substrate takes time, it is more preferable for the depressurized He atmosphere to be employed. It is preferable for the depressurized atmosphere to have a pressure within a range from 1 kPa to 90 kPa, and more preferably a pressure within a range from 1 kPa to 10 kPa.

The mold is pressed against the substrate at a pressure within a range from 100 kPa to 10 MPa. The flow of the resin is promoted, the residual gas is compressed, the residual gas dissolves into the photocuring resin, and the passage of He through the quartz substrate is promoted as the pressure is greater. However, if the pressure is excessive, there is a possibility that the mold and the substrate will be damaged if a foreign object is interposed between the mold and the substrate when the mold contacts the substrate. Accordingly, it is preferable for the pressure to be within a range from 100 kPa to 10 MPa, more preferably within a range from 100 kPa to 5 MPa, and most preferably within a range from 100 kPa to 1 MPa. The reason why the lower limit of the pressure is set to 100 kPa is that in the case that the space between the mold and the substrate is filled with liquid when performing imprinting within the atmosphere, the space between the mold and the substrate is pressurized by atmospheric pressure (approximately 101 kPa).

(Mold Release Step)

After the mold is pressed against the substrate and the photocuring resin film is formed, the mold is separated from the photocuring resin film. As an example of a separating method, the outer edge portion of one of the mold and the substrate may be held, while the rear surface of the other of the mold and the substrate is held by vacuum suction, and the held portion of the outer edge or the held portion of the rear surface is relatively moved in a direction opposite the pressing direction.

Hereinafter, the operational effects of the present invention will be described in detail.

The nanoimprinting method of the present invention sets the intersection angle formed between the main scanning direction Sm of the ink jet method when coating the quartz substrate 3 with the droplets D and the direction Ld of the lines of the straight linear pattern of protrusions and recesses P2, which is an intersection angle when pressing the Si mold against the surface of the quartz substrate 3, to be within a range from 30° to 90° (FIG. 1A and FIG. 1B). Thereby, imprinting defects due to fluctuations in the thickness of residual film and residual gas are suppressed even in cases that droplet arrangement defects occur.

Figure 8A:
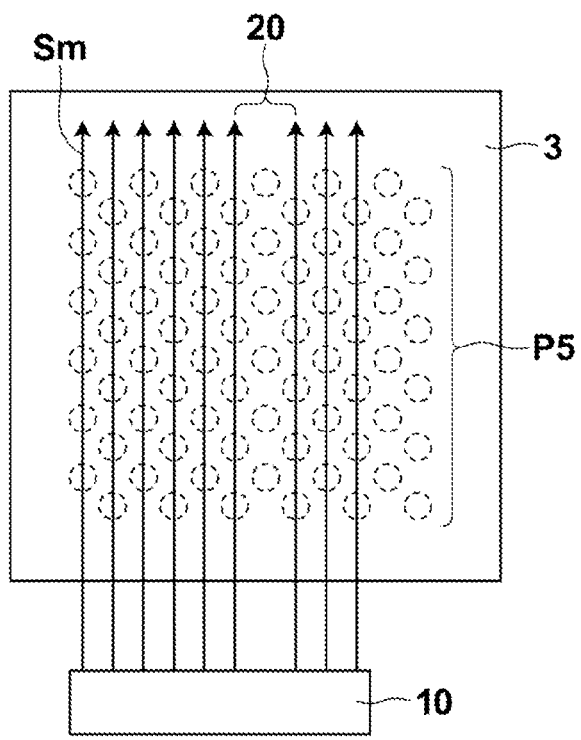
FIG. 8A is a diagram that illustrates the manner in which droplet arrangement defects occur caused by ink not being expelled due to clogs in ink jet nozzles.
Figure 8B:
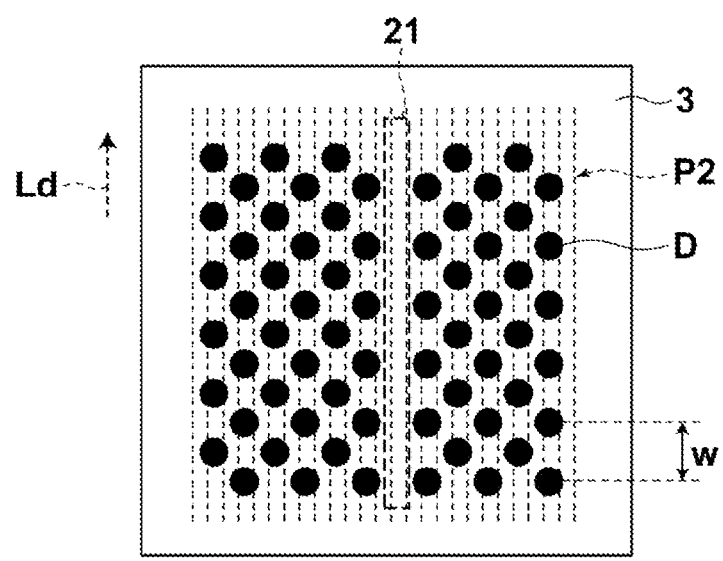
FIG. 8B is a diagram that illustrates the manner in which droplet arrangement defects occur caused by ink not being expelled due to clogs in ink jet nozzles.
Figure 8C:
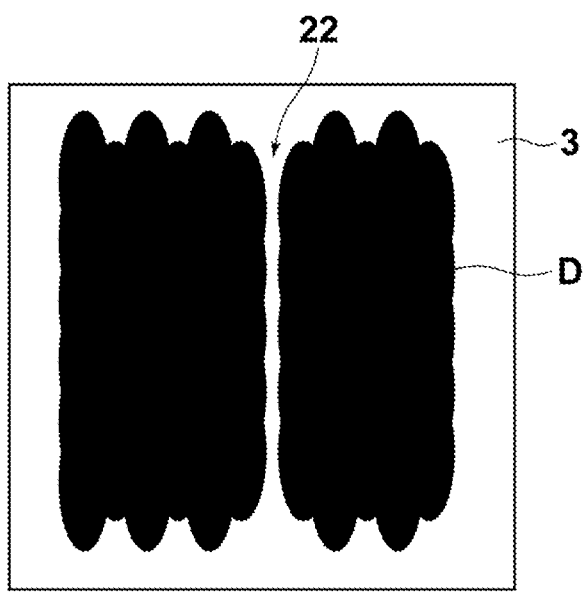
FIG. 8C is a diagram that illustrates the manner in which droplet arrangement defects occur caused by ink not being expelled due to clogs in ink jet nozzles.

The nanoimprinting method of the present invention takes advantage of anisotropy, which occurs in the spreading of the droplets along the direction of the lines of the linear pattern of protrusions and recesses. For example, a case that an intersection angle between a main scanning direction of the ink jet method employed to arrange droplets on a substrate and a direction of lines of a linear pattern of protrusions is 0° (FIGS. 8A and 8B), and a case in which the intersection angle is within a range from 30° to 90° (FIGS. 1A and 1B) will be considered. In the former case, the plurality of droplets which are coated on the substrate spread along the region at which the droplet arrangement defects 21 occur. That is, in this case, it is difficult for the resist material to be supplied to the region at which the droplet arrangement defects 21 occur (FIG. 8C). On the other hand, in the latter case, the plurality of droplets which are coated on the substrate spread across the region at which the droplet arrangement defects 21 occur. That is, the droplets spread to compensate for the droplet arrangement defects 21 (FIG. 1C). That is, in this case, supply of the resist material to the region at which the droplet arrangement defects 21 occur is facilitated. As a result, it becomes possible to suppress imprinting defects due to fluctuations in the thickness of residual film and residual gas, even in cases that droplet arrangement defects occur.

Figure 6A:
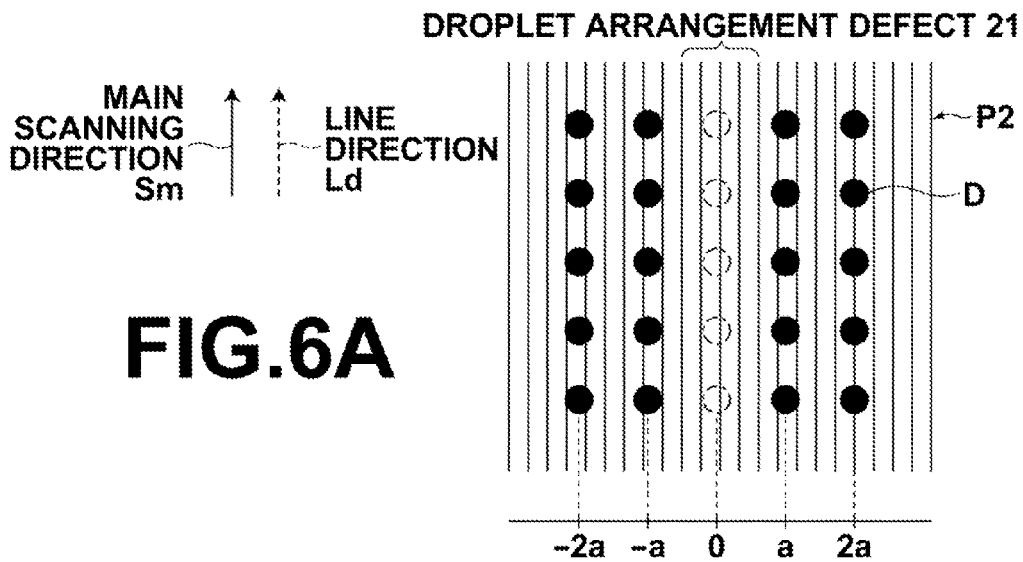
FIG. 6A is a diagram for explaining the relationship between a main scanning direction of the ink jet method and a direction of lines of a linear pattern of protrusions in the case that an intersection angle therebetween is 0°.
Figure 6B:
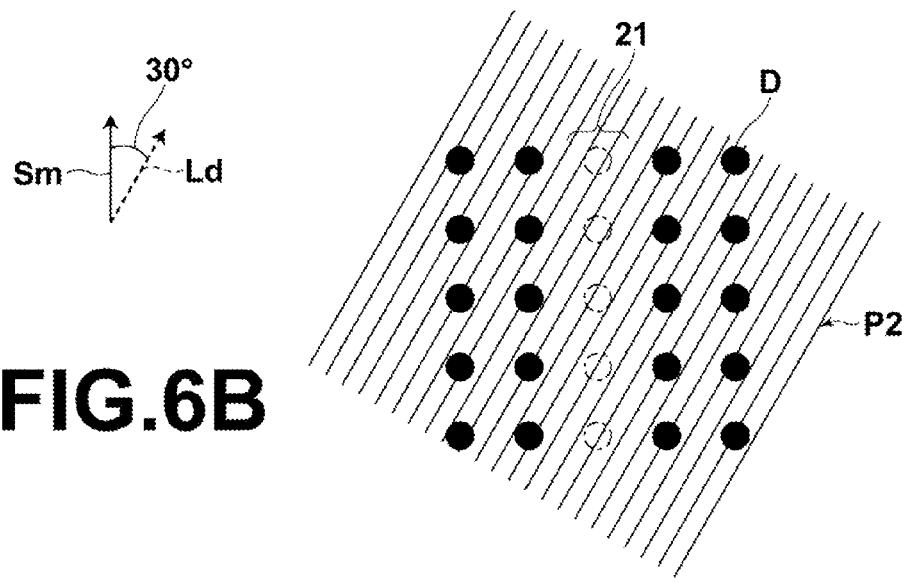
FIG. 6B is a diagram for explaining the relationship between a main scanning direction of the ink jet method and a direction of lines of a linear pattern of protrusions in the case that an intersection angle therebetween is 30°.
Figure 6C:
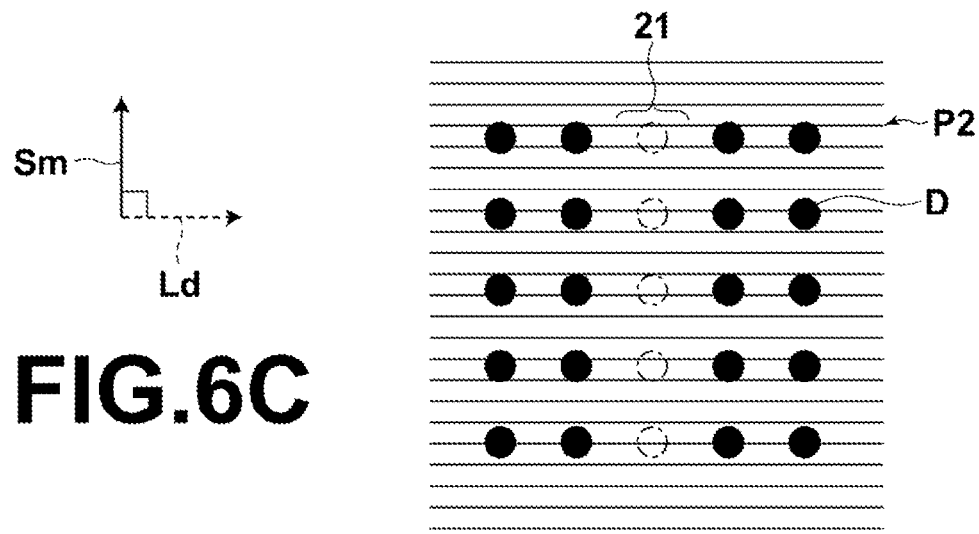
FIG. 6C is a diagram for explaining the relationship between a main scanning direction of the ink jet method and a direction of lines of a linear pattern of protrusions in the case that an intersection angle therebetween is 90°.
Figure 7:
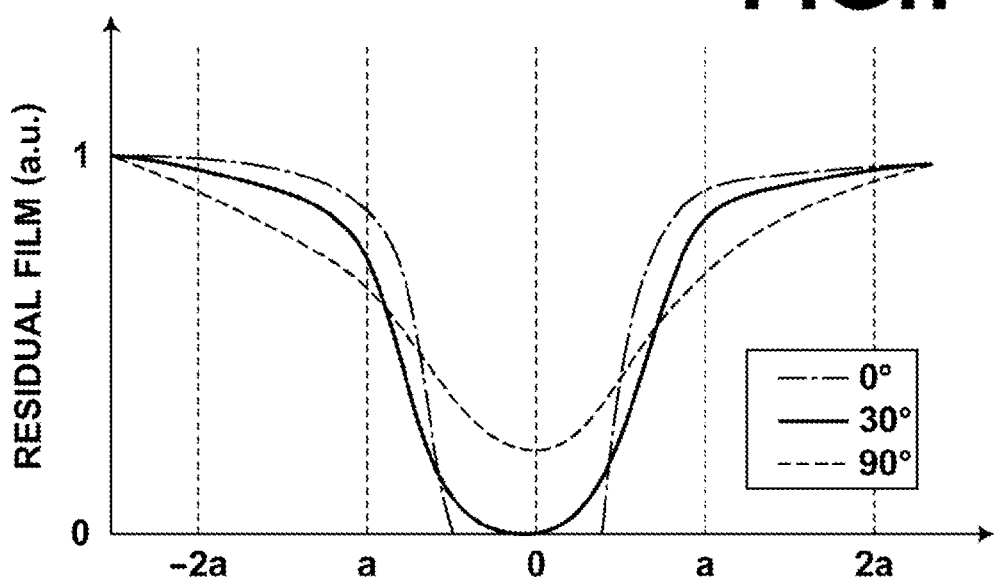
FIG. 7 is a graph that illustrates cross sectional profiles of residual films for cases in which resist films are formed by pressing droplets arranged as illustrated in FIGS. 6A through 6C with a mold, the thicknesses of the resist films are measured in directions that traverse regions at which droplet arrangement defects are present perpendicular to a main scanning direction Sm, and the thicknesses of the regions at which droplet arrangement defects are present are normalized by regions at which droplet arrangement defects are not present.

The manner in which droplet arrangement defects are corrected as the intersection angle becomes greater will be described with reference to FIGS. 6A through 6C, and FIG. 7. FIGS. 6A, 6B, and 6C illustrate case in which the intersection angle is 0°, 30°, and 90°, respectively. Note that only a plurality of droplets D having droplet arrangement defects 21 and a straight linear pattern P2 of a mold are illustrated in FIGS. 6A through 6C, for the sake of convenience. FIG. 7 is a graph that illustrates cross sectional profiles of residual films for cases in which resist films are formed by pressing droplets arranged as illustrated in FIGS. 6A through 6C with a mold, the thicknesses of the resist films at regions in which droplet arrangement defects 21 are present are measured in directions that perpendicularly traverse the main scanning direction Sm, and the thicknesses of the regions at which droplet arrangement defects 21 are present are normalized by regions at which droplet arrangement defects are not present. Note that in the drawings, the letter a denotes intervals among adjacent droplets. In the case that the intersection angle is 0° as in FIG. 6A, it is difficult for the resist material to be supplied to the region at which the droplet arrangement defects 21 occur. Therefore, the thickness of the residual film at the vicinity of the center of the region at which the droplet arrangement defects 21 occur is 0, completely exposing the substrate at this region as a result. In contrast, in the case that the intersection angle is 30° and 90° as illustrated in FIGS. 6B and 6C, respectively, the anisotropy in the spreading of the droplets supplies the resist material to the region in which the droplet arrangement defects 21 occur, resulting in a decrease in the exposed area of the substrate.

<Design Modifications>

Note that in the embodiment of the nanoimprinting method described above was described as a photocuring nanoimprinting method. However, the present invention is not limited to such a configuration, and the present invention may be applied to a thermal curing nanoimprinting method that employs thermally cured resin as well.

[Method for Producing a Substrate]

Next, an embodiment of a method for producing a substrate of the present invention will be described. The present embodiment will be described as a case in which a substrate is produced by the nanoimprinting method described previously, employing an Si mold as an original plate.

First, a resist film, on which a pattern has been transferred by the nanoimprinting method, is formed on a surface of a substrate. Then, dry etching is performed using the resist film having the transferred pattern as a mask, to form a pattern of protrusions and recesses corresponding to the pattern of protrusions and recesses of the resist film. Thereby, a substrate having a predetermined pattern is obtained.

In the case that the substrate is of a layered structure and includes a metal layer on the surface thereof, dry etching is performed using the resist film as a mask, to form a pattern of protrusions and recesses corresponding to the pattern of protrusions and recesses of the resist film in the metal layer. Thereafter, dry etching is further performed with the thin metal layer as an etching stop layer, to form a pattern of protrusions and recesses in the substrate. Thereby, a substrate having a predetermined pattern is obtained.

The dry etching method is not particularly limited as long as it is capable of forming a pattern of protrusions and recesses in the substrate, and may be selected according to specific objectives. Examples of dry etching methods that may be employed include: the ion milling method; the RIE (Reactive Ion Etching) method; the sputter etching method; etc. From among these methods, the ion milling method and the RIE method are particularly preferred.

The ion milling method is also referred to as ion beam etching. In the ion milling method, an inert gas such as Ar is introduced into an ion source, to generate ions. The generated ions are accelerated through a grid and caused to collide with a sample substrate to perform etching. Examples of ion sources include: Kauffman type ion sources; high frequency ion sources; electron bombardment ion sources; duoplasmatron ion sources; Freeman ion sources; and ECR (Electron Cyclotron Resonance) ion sources.

Ar gas may be employed as a processing gas during ion beam etching. Fluorine series gases or chlorine series gases may be employed as etchants during RIE.

As described above, the method for producing a substrate of the present invention performs dry etching, using the resist film onto which a pattern is transferred by the nanoimprinting method of the present invention as a mask. That is, a mask free of imprinting defects due to fluctuations in the thickness of residual film and residual gas is employed to perform dry etching. Therefore, it becomes possible to produce substrates highly accurately at high yields.

EXAMPLES

Examples of the nanoimprinting method of the present invention will be described below.

(Production of Si Mold)

First, a Si substrate was coated with a photoresist liquid having PMMA (polymethyl methacrylate) as a main component by the spin coat method, to form a photoresist layer. Thereafter, an electron beam, which was modulated according to a straight linear pattern of protrusion and recesses having a line width of 100 nm and a pitch of 200 nm, was irradiated onto the photoresist layer while scanning the Si substrate on an XY stage, to expose the straight linear pattern of protrusions and recesses on the entire surface of the 10 mm square (10 mm·10 mm) photoresist layer. Thereafter, the photoresist layer underwent a development process and the exposed portions were removed. Finally, selective etching was performed to a depth of 80 nm by RIE using the photoresist layer, from which the exposed portions were removed, as a mask, to obtain a first Si mold having the concentric pattern.
(Photocuring Resin)

Photocuring resins R1 through R9, which were prepared by adding photopolymerization initiating agents and fluorine monomers to polymerizable compounds as illustrated in Table 1 below, were employed.

TABLE 1

| Resist type | Amount of Polymerizable Compound (mass %) | | Amount of Polymerization Initiating Agent (mass %) | | Amount of Fluorine Monomer (mass %) | | Viscosity (cP) | Surface Energy (mN/m) |
|---|---|---|---|---|---|---|---|---|
| R1 | Compound A | 97.0 | Irgacure | 2.0 | Compound B | 1.0 | 10 | 30 |
| R2 | Viscoat 190 | | 379 | | | | 3 | 30 |
| R3 | Viscoat 160 | | | | | | 8 | 30 |
| R4 | Aronix | 77.0 | Aronix | 20.0 | | | 20 | 30 |
| R5 | M220 | 40.0 | M310 | 57.0 | | | 35 | 30 |
| R6 | Compound A | 95.0 | — | — | | 3.0 | 10 | 20 |
| R7 | | 96.0 | | | | 2.0 | 10 | 25 |
| R8 | | 97.8 | | | | 0.2 | 10 | 35 |
| R9 | | 98.0 | | | — | — | 10 | 40 |

(Substrate)

The surface of a quartz substrate was processed with KBM-5103 (by Shin-Etsu Chemical Industries, K.K.), which is a silane coupling agent having superior close contact properties with respect to the photocuring resin. The KBM-5103 was diluted to 1% by mass using PGMEA (Propylene Glycol Monomethyl Ether Acetate), and coated on the surface of the substrate by the spin coat method. Thereafter, the coated substrate was annealed for 20 minutes at 120° C. on a hot plate, causing the silane coupling agent to bond to the surface of the substrate.
(Photocuring Resin Coating Step)

DMP-2831, which is an ink jet printer of the piezoelectric type by FUJIFILM Dimatix, was utilized. DMC-11610, which is a dedicated 10 pl head, and DMC-11601, which is a dedicated 1 pl head, were utilized as an ink jet head. Ink expelling conditions were set and adjusted in advance to achieve a desired amount of resin in each arranged droplet. For example, adjustments were performed such that 1 pl droplets were expelled five times at the same location in the case that the amount of photocuring resin in each coated droplet is set to 5 pl. The droplet arrangement density is calculated based on the spatial volume of the recesses of the straight linear pattern of protrusions and recesses within a predetermined region such that the thickness of the residual film will be 10 nm, to generate a droplet arrangement pattern constituted by square lattices. Note that the droplet arrangement pattern was purposely generated to include a column in the scanning direction in which droplets are not expelled, as droplet arrangement defects to test the advantageous effects of the present invention. The lattice intervals of the droplet arrangement pattern were changed as appropriate according to the amount of photocuring resin in each droplet. The intervals were set to 141 μm in the case that the amount of photocuring resin in each droplet was 1 pl, 315 μm in the case that the amount of photocuring resin in each droplet was 5 pl, 446 μm in the case that the amount of photocuring resin in each droplet was 10 pl, and 631 μm in the case that the amount of photocuring resin in each droplet was 20 pl. The expelling conditions were set and adjusted as described above, and droplets were arranged in straight line transfer regions according to the droplet arrangement pattern.
(Si Mold Pressing Step)

The droplet arrangement pattern and the pattern of protrusions and recesses of the Si mold were positionally aligned with respect to each other. Specifically, the Si mold and the quartz substrate were caused to approach each other such that the gap therebetween was 0.1 mm or less. Next, the droplet arrangement pattern and the pattern of protrusions and recesses of the mold were observed with a microscope from the underside of the quartz substrate, and the Si mold or a stage that the quartz substrate was placed on was rotated and moved such that the intersection angle became a predetermined value.

With respect to the He atmospheric conditions, the space between the Si mold and the quartz substrate was replaced with a gas which is 99% He by volume or greater. With respect to the depressurized atmospheric conditions, depressurization was performed to 10 kPa, to form a depressurized He environment after the space between the Si mold and the quartz substrate was replaced with a gas which is 99% He by volume or greater as described above. With respect to the air atmospheric conditions, the gas components within the air were not adjusted. The Si mold was caused to contact the droplets under one of the aforementioned conditions. After contact, the manner in which the droplets spread was observed with a microscope from the underside of the quartz substrate, and the amounts of time until residual gas between among the droplets disappeared after contact were measured. After the residual gas disappeared or reached an equilibrium state in which there was no change in the amount of residual gas, ultraviolet light including a wavelength of 360 nm as irradiated at a dosage of 300 mJ/cm$^2$, to cure the photocuring resin.
(Si Mold Release Step)

The outer edge portions of the quartz substrate and the Si mold were mechanically held or the back surfaces thereof were held by suction, and the Si mold was relatively moved in a direction opposite the pressing direction, to release and separate the Si mold. Thereby, a plurality of photocuring resin films, on which the pattern of protrusions and recesses is transferred, were obtained.

(Quartz Substrate Processing Step)

As will be described below, dry etching was performed as described below using the photocuring resin films, on which the pattern of protrusions and recesses is transferred, as masks. Thereby, shapes of protrusions and recesses based on the pattern of protrusions and recesses of the photocuring resin film were formed on the quartz substrate, to obtain a quartz mold having a predetermined pattern of protrusions and recesses. First, the residual film present at the recesses of the pattern was removed by oxygen plasma etching, to expose the quartz substrate at the recesses of the pattern. At this time, conditions were set such that the amount of etching is capable of removing the thickest residual film within the region of the pattern of protrusions and recesses. Next, RIE using a fluorine series gas was administered on the quartz substrate, using the protrusions of the pattern as a mask. The RIE conditions were set such that the depth of etching was 80 nm. Finally, the residue of the protrusions of the pattern was removed by oxygen plasma etching.

The plurality of photocuring resin films onto which patterns were transferred were produced under different conditions as indicated in Table 2 by employing various combinations of the materials and processing conditions.

Hereinafter, the standards for evaluating the advantageous effects of the nanoimprinting method of the present invention will be described. Evaluation of the advantageous effects was performed by individually evaluating the photocuring resin films on which patterns were transferred under the various conditions indicated in Table 2 with respect to the following three criteria. Points were designated according to the evaluation results, and total scores were calculated by integrating all of the points. If the total score was 0, no advantageous effect was recognized with respect to the objective of the present invention, "to suppress imprinting defects due to fluctuations in the thickness of residual film and residual gas even in cases that droplet arrangement defects occur", whereas an advantageous effect was recognized if the total score was 1 or greater.

(Criterion 1: Imprinting Defects)

The patterns of protrusions and recesses of the photocuring resin films were inspected by performing dark field measurements with an optical microscope (magnification: 50× to 1500×). First, 2 mm square fields (2 mm·2 mm) were defined at a magnification of 50×. Next, 1 cm square regions (1 cm·1 cm) were scanned while maintaining the 2 mm square fields, to ascertain the presence of defects due to residual gas. Defects due to residual gas were judged to be present in cases that scattered light, which should not be present in a normal pattern, was observed. The total number of defects due to residual gas was counted. In the case that the number of defects per 1 cm square area was 0, a score of 1 was designated for this criterion point. In the case that the number of defects per 1 cm square area was 1 or more, a score of 0 was designated for this criterion points.

(Criterion 2: Thickness of Residual Film)

The thicknesses of the residual films of each of the photocuring resin films were measured. The substrates were exposed by scratching or removing portions of the patterned regions of the photocuring resin films with tape, and the thicknesses of the residual films were measured by measuring the boundary portions between the removed portions and the pattern regions by an AFM (Atomic Force Microscope). The thicknesses of the residual films were measured at 10 locations within each pattern region, and average values of the 10 measured thicknesses were designated as the thickness of the residual films. Although the residual films of the photocuring resin films are removed prior to the step of producing substrates, it is preferable for the thickness of the residual film at regions at which droplet arrangement defects occur to have a certain degree of thickness, based on a relationship with the thickness of the residual film at regions at which droplet arrangement defects do not occur. In the case that the thickness h of the residual film at regions at which droplet arrangement defects occurred was 5≤h<15 nm, a score of 2 was designated for this criterion. In the case that the thickness h of the residual film at regions at which droplet arrangement defects occurred was 0<h<5 nm, a score of 1 was designated for this criterion. In the case that the thickness h of the residual film at regions at which droplet arrangement defects occurred was h=0, a score of 0 was designated for this criterion.

(Criterion 3: Resist Material Filling Time)

The amounts of time until residual gas between among the droplets disappeared after contact in the mold pressing step were considered as resist material filling times. In the case that the filling time was less than 10 seconds, a score of 2 was designated for this criterion. In the case that the filling time was greater than or equal to 10 seconds and less than 1 minute, a score of 1 was designated for this criterion. In the case that the filling time was greater than or equal to 1 minute or in the case that residual gas did not disappear, a score of 0 was designated for this criterion.

(Evaluation Results)

As indicated in Table 2, photocuring resin films obtained as Examples 1 through 12 of the present invention accurately inverted the straight linear pattern of protrusions and recesses of the Si mold, and were films without fluctuations in the thickness of residual films or imprinting defects. In addition, the photocuring resin films obtained as Examples 1 through 12 of the present invention were capable of being obtained in short periods of time.

Here, from the results obtained for Examples 1 through 4 and the results obtained for Comparative Examples 1 and 2 indicated in Table 2, it can be said that a favorable range of intersection angles between a main scanning direction of the ink jet method and the direction of the lines of the linear pattern of protrusions and recesses is from 30° to 90°.

From the results obtained for Examples 1, 5, and 6 and the results obtained for Comparative Examples 3 and 4, it can be said that a favorable range of viscosities of resist material is from 8 cP to 20 cP. Further, at the same time, results were obtained that indicate that the evaluation of films deteriorate for Criteria 1 and 2 if the viscosity is low. These results run counter to general expectations that lower viscosities are advantageous when forming resist films due to spreading of droplets being more effective if viscosity is low.

From the results obtained for Examples 1, 7, and 8 and the results obtained for Comparative Examples 5 and 6, it can be said that a favorable range of surface energies of resist material is from 25 mN/m to 35 mN/m. Further, at the same time, results were obtained that indicate that the evaluation of films deteriorate for Criteria 1 and 2 if the surface energy is low. These results run counter to general expectations that lower surface energies are advantageous when forming resist films due to spreading of droplets being more effective if surface energy is low.

From the results obtained for Examples 1, 9, and 10 and the results obtained for Comparative Example 7, it can be said that a favorable range of amounts of resist material in each droplet is from 1 pl to 10 pl.

From the results obtained for Examples 1, 11, and 12 and the results obtained for Comparative Example 8, it can be said that a He atmosphere and/or a depressurized atmosphere is preferable as the atmosphere when pressing the mold against the resist film.

Straight linear patterns of protrusions and recesses that accurately reflect the straight linear pattern of protrusions and recesses of the Si mold and have no defects were able to be formed on quartz substrates by processing the quartz substrates using the photocuring resin films obtained as Examples 1 through 12 of the present invention as masks.

TABLE 2

| | Angle (degrees) | Resist Viscosity (cP) | Resist Film Surface Energy (mN/m) | Amount of Material in Each Droplet (pL) | Atmosphere | Imprinting Defects | Residual Film Thickness | Fillling Ti1me | Total Score |
|---|---|---|---|---|---|---|---|---|---|
| Example 1 | 30 | 10 | 30 | 10 | He | 1 | 1 | 1 | 1 |
| Example 2 | 45 | | | | | 1 | 1 | 1 | 1 |
| Example 3 | 60 | | | | | 1 | 1 | 1 | 1 |
| Example 4 | 90 | | | | | 1 | 2 | 1 | 2 |
| Comparative Example 1 | 0 | | | | | 0 | 0 | 0 | 0 |
| Comparative Example 2 | 15 | | | | | 0 | 0 | 0 | 0 |
| Example 5 | 30 | 8 | | | | 1 | 1 | 1 | 1 |
| Example 6 | | 20 | | | | 1 | 1 | 1 | 1 |
| Comparative Example 3 | | 3 | | | | 0 | 0 | 1 | 0 |
| Comparative Example 4 | | 35 | | | | 1 | 1 | 0 | 0 |
| Example 7 | | 10 | 25 | | | 1 | 1 | 1 | 1 |
| Example 8 | | | 35 | | | 1 | 1 | 1 | 1 |
| Comparative Example 5 | | | 20 | | | 0 | 0 | 1 | 0 |
| Comparative Example 6 | | | 40 | | | 0 | 1 | 1 | 0 |
| Example 9 | | | 30 | 1 | | 1 | 1 | 2 | 2 |
| Example 10 | | | | 5 | | 1 | 1 | 1 | 1 |
| Comparative Example 7 | | | | 20 | | 1 | 1 | 0 | 0 |
| Example 11 | | | | 10 | Vacuum | 1 | 1 | 2 | 2 |
| Comparative Example 8 | | | | | Air | 0 | 1 | 0 | 0 |
| Example 12 | | | | 1 | Vacuum | 1 | 2 | 2 | 4 |

What is claimed is:

1. A nanoimprinting method, comprising:
coating a substrate with a plurality of droplets of resist material by the ink jet method; and
pressing a linear pattern of protrusions and recesses of a mold onto the surface of the substrate which is coated with the droplets, to spread the droplets on the substrate, to form a resist film constituted by bonds among the spread plurality of droplets and to transfer the linear pattern of protrusions and recesses onto the resist film;
the droplets being coated under the conditions of: the viscosity of the resist material being within a range from 8 cP to 20 cP, the surface energy of the resist material being within a range from 25 mN/m to 35 mN/m, the amount of resist material in each of the plurality of droplets being within a range from 1 pl to 10 pl, and the placement intervals among the droplets being within a range from 10 μm to 1000 μm, and such that an intersection angle formed between a main scanning direction of the ink jet method when coating the substrate with the droplets and the direction of the lines of the linear pattern of protrusions and recesses, which is an intersection angle when pressing the mold against the surface of the substrate, is within a range from 30° to 90°; and
the mold being pressed against the surface of the substrate in a He and/or a depressurized atmosphere.

2. A nanoimprinting method as defined in claim 1, wherein: the resist material is a photocuring resin.

3. A method for producing a substrate, comprising:
forming a resist film, onto which a pattern of protrusions and recesses has been transferred by the nanoimprinting method of claim 1, on a substrate; and
performing dry etching using the resist film as a mask, to form a pattern of protrusions and recesses corresponding to the pattern of protrusions and recesses transferred onto the resist film on the substrate, and to obtain a substrate having a predetermined pattern.

4. A method for producing a substrate, comprising:
forming a resist film, onto which a pattern of protrusions and recesses has been transferred by the nanoimprinting method of claim 2, on a substrate; and
performing dry etching using the resist film as a mask, to form a pattern of protrusions and recesses corresponding to the pattern of protrusions and recesses transferred onto the resist film on the substrate, and to obtain a substrate having a predetermined pattern.

* * * * *